(12) United States Patent
Pang et al.

(10) Patent No.: US 6,946,336 B2
(45) Date of Patent: Sep. 20, 2005

(54) METHOD OF MAKING A NANOSCALE ELECTRONIC DEVICE

(75) Inventors: Harry F. Pang, Houston, TX (US); James M. Tour, Bellaire, TX (US)

(73) Assignee: William Marsh Rice University, Houston, TX (US)

(*) Notice: Subject to any disclaimer, the term of this patent is extended or adjusted under 35 U.S.C. 154(b) by 0 days.

(21) Appl. No.: 10/436,704

(22) Filed: May 13, 2003

(65) Prior Publication Data

US 2004/0110350 A1 Jun. 10, 2004

Related U.S. Application Data

(60) Provisional application No. 60/380,000, filed on May 13, 2002.

(51) Int. Cl.[7] .......................................... H01L 21/8238
(52) U.S. Cl. ....................... 438/199; 438/238; 438/386; 438/637; 438/647; 438/648; 438/650; 438/672
(58) Field of Search ................................ 438/199, 238, 438/243, 386, 637, 647, 648, 650, 672

(56) References Cited

U.S. PATENT DOCUMENTS

| | | | | |
|---|---|---|---|---|
| 5,712,201 A | * | 1/1998 | Lee et al. ................. | 438/239 |
| 6,043,115 A | * | 3/2000 | Pan ........................... | 438/199 |
| 6,064,085 A | * | 5/2000 | Wu ........................... | 257/296 |
| 6,319,824 B1 | * | 11/2001 | Lee et al. ................. | 438/639 |
| 2002/0048865 A1 | * | 4/2002 | Manning ................. | 438/153 |

OTHER PUBLICATIONS

*Alternative Gate Dielectrics For Microelectronics,* Robert M. Wallace and Glen Wilk, MRS Bulletin, vol. 27, No. 3, pp. 186–191, Mar. 2002.

*High–κ Gate Dielectric Materials,* Robert M. Wallace and Glen Wilk, MRS Bulletin, vol. 27, No. 3, pp. 192–197, Mar. 2002.

*A Thermodynamic Approach to Selecting Alternative Gate Dielectrics,* Darrell G. Schlom and Jeffrey H. Haeni, MRS Bulletin, vol. 27, No. 3, pp. 198–204, Mar. 2002.

(Continued)

Primary Examiner—George Fourson
Assistant Examiner—Michelle Estrada
(74) Attorney, Agent, or Firm—Hugh R. Kress; Browning Bushman PC (57) ABSTRACT

The present invention relates to a method of making a nanoscale electronic device wherein said device comprises a gap between about 0.1 nm and about 100 nm between at least two conductors, semiconductors or the combination thereof. The method features complete assembly of electrical contacts before addition of a molecular component thereby preserving the integrity of the molecular electronic component and maintaining a well-formed gap. The gap produced is within the nanoscale regime, has uniform width and is further characterized by surfaces that are uniformly smooth.

22 Claims, 3 Drawing Sheets

OTHER PUBLICATIONS

*Materials Characterization of Alternative Gate Dielectrics,* Brett W. Busch et al., MRS Bulletin, vol. 27, No. 3, pp. 206–211, Mar. 2002.

*Issues in High–κ Gate Stack Interfaces,* Veena Misra et al., MRS Bulletin, vol. 27, No. 3, pp. 212–216, Mar. 2002.

*Electronic Structure and Band Offsets of High–Dielectric Constant Gate Oxides,* John Robertson, MRS Bulletin, vol. 27, No. 3, pp. 217–221, Mar. 2002.

*On the Electrical Characterization of High–κ Dielectrics,* R. Degraeve et al., MRS Bulletin, vol. 27, No. 3, pp. 222–225, Mar. 2002.

*Compatibility Challenges for High–κ Materials Integration Into CMOS Technology,* Supratik Guha et al., MRS Bulletin, vol. 27, No. 3, pp. 226–229, Mar. 2002.

*Thermal Processing Looks to Speed, Lower Temperatures,* A.E. Braun, Senior Editor, Semiconductor International, pp. 44–46, 48, Mar. 2003.

*Nanoscale Molecular–Switch Devices Fabricated by Imprint Lithography,* Y. Chen et al., Applied Physics Letters, vol. 78, No. 23, pp. 1610–1612, Mar. 10, 2003.

*Molecular Random Access Memory Cell,* M.A. Reed et al., Applied Physics Letters, vol. 78, No. 23, pp. 3735–3737, Jun. 4, 2001.

Entire Book: *Molecular Electronics—Commercial Insights, Chemistry, Devices, Architecture and Programming,* J.M. Tour, Rice University, USA, World Scientific Publishing Co., 2003.

* cited by examiner

METHOD OF MAKING A NANOSCALE ELECTRONIC DEVICE

CROSS-REFERENCE TO RELATED APPLICATIONS

This nonprovisional patent application claims the benefit of U.S. Provisional Patent Application Ser. No. 60/380,000, filed May 13, 2002.

STATEMENT REGARDING FEDERALLY SPONSORED RESEARCH OR DEVELOPMENT

The research carried out in connection with this invention was funded by Defense Advanced Research Projects Agency (DARPA) administered by the Office of Naval Research (ONR), Grant No. N00014-01-1-0657.

FIELD OF THE INVENTION

The present invention relates to a method of making a nanoscale electronic device wherein said device comprises a gap between about 0.1 nm and about 100 nm between at least two conductors, semiconductors or the combination thereof. The present method comprises, in part, depositing an insulating dielectric onto a conductor or semiconductor in a manner sufficient to precisely obtain a uniformly thin and smooth layer of said insulating dielectric. The method further comprises depositing a quantity of another conductor or semiconductor onto said insulator and still further comprises removing at least a portion of said insulating dielectric in such a manner as to create a gap between the conductors, semiconductors or the combination thereof. The gap produced is within the nanoscale regime, has uniform width and is further characterized by surfaces that are uniformly smooth. After the gap has been fashioned, it is possible to add a molecular electronic component thereby preserving the integrity of both the gap and molecular electronic component.

BACKGROUND OF THE INVENTION

Since the inception of the computer, steady increases in computing performance have been enabled by making transistors (devices) smaller. In the case of integrated circuits, reduced device size increases the number of transistors and decreases the distance between them collectively resulting in increases in processing power and speed. Continued advances in computer power depend on making devices that approach the nanoscale. Such devices present numerous difficulties with respect to manufacturing, lithography and indeed physical laws that make the use of silicon transistors at the nanoscale subject to quantum tunneling effects. Because of these problems current CMOS transistors cannot easily be scaled to these dimensions.

Contemporary integrated circuits utilize a type of random access memory (RAM) known as DRAM (Dynamic Random Access Memory) for storing a bit of information as an electric charge. A typical DRAM comprises a metal oxide semiconductor (MOS) transistor for which the drain of said MOS transistor is connected to a capacitor, most often the gate of an adjacent transistor. The capacitor stores the charge and in this way, a bit of information can be retained and later recalled. The amount of charge that can be stored in a capacitor is a property dependent upon the plate area of the capacitor. DRAM requires frequent refresh to replenish charge that leaches from the capacitor. It remains a significant challenge to squeeze high performance from transistors of remarkably small dimensions; in particular, retaining charge in capacitors of diminishing area and reducing refresh frequencies represent nontrivial problems in the art.

Molecular electronics has the potential to augment or completely replace conventional devices with electronic elements fashioned from nanoscale entities. Such elements can be altered by externally applied voltages and have the potential to scale from micron-sized dimensions to nanometer-scale dimension with little change in the device concept. The molecular switching elements can be formed by inexpensive solution techniques. The self-assembled switching elements may be integrated on top of a silicon integrated circuit so that they can be driven by conventional silicon electronics in the underlying substrate. To address the switching elements, interconnections or wires are used.

Prior proposed nanoscale devices have invoked a number of methods, features and approaches. It has been suggested that fine scale lithography using X-rays, electrons, ions, scanning probes, or stamping could be used to print the requisite pattern for device components on a chip. Alternatively, these techniques could be used to directly carve such features into a chip. Another method utilizes chemical synthesis to link molecular device components via covalent bonds. The major problem with fine scale lithography is that the wafer on which the devices are built must be aligned to within a small fraction of the size of the device features in at least two dimensions for several successive stages of lithography, followed by etching or deposition to build the devices. This level of control does not scale well as device sizes are reduced to nanometer scale dimensions. The main problem with direct writing is that it is a serial process, and direct writing a wafer full of complex devices, each containing trillions of components, could well require years. Finally, with respect to chemical synthesis, high information content molecules are typically macromolecular structures such as proteins or DNA, and both have extremely complex, and, to date, unpredictable secondary and tertiary structures that cause them to twist into helices, fold into sheets, and form other complex 3D structures that will have a significant and usually deleterious effect on their desired electrical properties as well as make interfacing them to the outside world impossible.

Molecular electronic devices comprising crossed wire switches hold promise for future electronic and computational devices. Thin single or multiple atomic layers can be formed, for example, by Langmuir-Blodgett techniques or self-assembled monolayers at a specific site. A crossed wire switch may comprise two wires, or electrodes, for example, with a molecular switching species between the two electrodes.

The so-called crossbar technology of Hewlett-Packard has explored many of the issues associated with nanoscale electronic devices.

U.S. Pat. No. 6,459,095 B1 to Heath et al discloses a route to the fabrication of electronic devices wherein the devices consist of two crossed wires sandwiching an electrically addressable molecular species. The device can be used to produce crossbar switch arrays, logic devices, memory devices, and communication and signal routing devices. The route of the '095 patent enables construction of molecular electronic devices on a length scale that can range from micrometers to nanometers via a chemical assembly procedure.

U.S. Pat. No. 6,432,740 B1 to Chen discloses a method of fabricating a molecular electronic device or crossbar memory that involves forming a top electrode after forming the molecular switch. The device comprises at least one pair of crossed wires and a molecular switch film therebetween. The method comprises: (a) forming at least one bottom electrode on a substrate by first forming a first layer on the substrate and patterning the first layer to form the bottom electrode by an imprinting technique; (b) forming the molecular switch film on top of the bottom electrode; (c) optionally forming a protective layer on top of the molecular switch film to avoid damage thereto during further processing; (d) coating a polymer layer on top of the protective layer and patterned the polymer layer by the imprinting method to form openings that expose portions of the protective layer; and (e) forming at least one top electrode on the protective layer through the openings in the polymer layer by first forming a second layer on the polymer layer and patterning the second layer. The imprinting method can be used to fabricate nanoscale patterns over a large area at high speeds acceptable in industrial standards.

U.S. patent application U.S. 2002/0176276 A1 to Zhang et al discloses molecular systems for electric field activated switches, such as a crossed-wire device or a pair of electrodes to which the molecular system is linked by linking moieties. The crossed-wire device comprises a pair of crossed wires that form a junction where one wire crosses another at an angle other than zero degrees and at least one connector species connecting the pair of crossed wires in the junction. The connector species comprises the molecular system, which has an electric field induced band gap change, and thus a change in its electrical conductivity that occurs via one of the following mechanisms: (1) molecular conformation change; (2) change of extended conjugation via chemical bonding change to change the band gap; or (3) molecular folding or stretching.

U.S. Pat. No. 6,512,119 B2 to Bratkovski et al discloses crossed-wire devices that comprise a pair of crossed wires that form a junction where one wire crosses another at an angle other than zero degrees and at least one connector species connecting the pair of crossed wires lies within the junction. The junction has a function dimension in nanometers, wherein at least one connector species and the pair of crossed wires form an electrochemical cell.

U.S. Pat. No. 5,772,905 to Chou discloses a lithographic method and apparatus for creating ultra-fine (sub-25 nm) patterns in a thin film coated on a substrate in which a mold having at least one protruding feature is pressed into a thin film carried on a substrate. The protruding feature in the mold creates a recess of the thin film. The mold is removed from the film. The thin film then is processed such that the thin film in the recess is removed exposing the underlying substrate. Thus, the pattern in the mold is replaced in the thin film, completing the lithography. The patterns in the thin film will be, in subsequent processes, reproduced in the substrate or in another material which is added onto the substrate.

U.S. Pat. No. 6,314,019 B1 to Kuekes et al discloses a molecular-wire crossbar interconnect for signal routing and communications between a first level and a second level in a molecular-wire crossbar. The molecular wire crossbar comprises a two-dimensional array of a plurality of nanometer-scale switches. Each switch is reconfigurable and self-assembling and comprises a pair of crossed wires which form a junction where one wire crosses another and at least one connector species connecting the pair of crossed wires in the junction. The connector species comprises a bi-stable molecule. Each level comprises at least one group of switches and each group of switches comprises at least one switch, with each group in the first level connected to all other groups in the second level in an all-to-all configuration to provide a scalable, defect-tolerant, fat-tree networking scheme.

One prior art method, as described in Reed et al. Applied Physics Letters, 2001, vol. 78, no. 23, pg. 3735–3737, involves a nanoscale electronic device made by depositing a second electrode by sputtering or chemical vapor deposition (CVD) atop a molecular electronic component that lies upon a first electrode. Both sputtering and CVD techniques involve the use of energetic metal atoms that may easily penetrate and destroy the delicate mono- or multi-layer of molecular electronic component and/or establish a contact through the molecular electronic component. The resulting direct interelectrode connection and consequent electrical short gives rise to a shorted, i.e. defective, electronic device.

Despite advances to date in making nanoscale electronic devices, there remains a need for methods of making nanoscale electronic devices wherein the method does not introduce features that can give rise to short circuits in the devices made. In addition, it remains desirable to provide methods of making nanoscale devices comprising molecules that preserve both the integrity of the molecular component and the surfaces to which they are adjoined. Furthermore, there remains a need for methods of making nanoscale electronic devices that are uniform with respect to device dimension and smoothness at the nanoscale regime. Notwithstanding the previous work, the need for methods of effectively and efficiently making nanoscale devices remains less than fully solved.

SUMMARY OF THE INVENTION

Thus, the present invention solves the problem of making a device wherein at least two conductors or semiconductors form a nanoscale gap. In notable contrast to some prior art wherein the addition of electrical contacts takes place both before and after formation of a delicate organic component, the present method completes assembly of electrical contacts before addition of a molecular component. In this way, the delicate molecular electronic component is preserved and gaps remain well-formed, the prospect of short circuits being precluded by the method of manufacture. In addition, the present method creates a gap that is uniformly wide and smooth.

In one aspect, the present invention discloses a method of making a nanoscale electronic device. The nanoscale electronic device of the present invention comprises a first material that is a conductor or semiconductor; optionally, a second material that is an insulator; a third material that is a conductor or semiconductor; and at least one molecular electronic component. The present method of making a nanoscale electronic devices comprises depositing a quantity of the first material in a given shape and orientation onto a substrate; depositing a quantity of the second material onto the first material in a manner sufficient to obtain a uniform layer of desired thickness of the second material onto the first material; depositing a quantity of the third material onto the second material in a given shape and orientation such that when viewed from at least one direction said first, second and third materials share a common area of intersection; removing at least a portion of the second material in such a manner as to create a gap between the first and third materials; and adding at least one molecular electronic component to the gap.

DETAILED DESCRIPTION OF THE INVENTION

The present method permits for the creation of electronic devices of nanoscale dimensions. Specifically, the devices made will feature a gap that is between about 0.1 nm and about 100 nm in width. Furthermore, the present method is less susceptible to produce devices that are inoperable by virtue of electrical shorts introduced during the method of making. As described above, some previously employed methods suffer from the tendency to provide a high number of defective devices. This can, in one aspect, be attributed to the inherent assembly order. In those cases in which addition of a second electrical contact is performed after and atop a molecular electronic component, those methods have had the potential drawback that the integrity of the delicate molecular electronic component is often compromised by addition of a second electrical contact. Indeed, the yield of such devices may be less than 5%. Please see for example "Molecular Electronics: Commercial Insights, Chemistry, Devices, Architecture and Programming", by James M. Tour, World Scientific, 2003, incorporated herein by reference. The present method amends these shortcomings by fashioning a gap between at least two conductors or semiconductors prior to introduction of a molecular electronic component, thereby preventing short circuits as encountered in the prior art. The molecular electronic component may be introduced by a chemical self-assembly processes or a directed assembly process wherein a voltage pulse is used to direct molecules between only one set of juxtaposed electrodes to the exclusion of the others. For reference to directed assembly, please see U.S. patent application Ser. No. 10/090,211, "Electrochemically Accelerated Self-Assembly of Molecular Devices" to Tour et al, filed Mar. 4, 2002, incorporated herein by reference.

The present invention presents, in one aspect, a method of making a nanoscale electronic device. As used herein, a nanoscale electronic device may be any article between about 0.1 nm and about 100 nm in dimension capable of carrying out some electronic function, such as but not limited to, signal attenuation, signal amplification, signal switching, charge storage, memory and the like.

The nanoscale electronic device made by the method of the present invention comprises a first material that is a conductor or semiconductor; optionally, a second material that is an insulator; a third material that is a conductor or semiconductor; and at least one molecular electronic component.

The nanoscale electronic device of the current invention is characterized by a gap between about 0.1 nm and about 100 nm between the first and third materials; more preferably between about 1 nm and about 50 nm. A notable feature of the present invention is the ability to consistently assemble electronic devices having gaps in the nanoscale dimension that are substantially smooth; that is, gaps made using the present method are not rough and are therefore consistent in width over the area of the gap. As used herein a gap is a space of uniform dimension between two flat area expanses. It should be noted that flat area expanses may only be relatively flat on the scale of the gap and observation at the macroscale may reveal surfaces that are not flat; that are, for example, curved. The gap of the present device comprises at least one of the aforementioned molecular electronic components and, optionally, a portion of the second material.

The present method of making a nanoscale electronic devices comprises depositing a quantity of the first material in a given shape and orientation onto a substrate; depositing a quantity of the second material onto the first material in a manner sufficient to obtain a uniform layer of desired thickness of the second material onto the first material; depositing a quantity of the third material onto the second material in a given shape and orientation such that when viewed from at least one direction said first, second and third materials share a common area of intersection; removing at least a portion of the second material in such a manner as to create a gap between the first and third materials; and adding at least one molecular electronic component to the gap.

The present nanoscale electronic device comprises a first material deposited in a given shape and orientation onto a substrate. The first material of the present invention may be a conductor or a semiconductor. According to one preferred embodiment of the present invention, the first material is a conductor. It will be noted that nearly any material classified as a conductor may be used in the present invention. Indeed, the only limitation upon the conductor selected is the nature of the molecular electronic component. Although the inventors tend to rely on empiricism in selecting a suitable conductor, the inventors are guided by certain non-binding principles. Without wishing to be bound by any one theory, the inventors believe that the optimal conductor can be found based on matching the Fermi level of the metal with the highest conducting molecular orbital of the molecular electronic component that is in direct contact with the conductor. Furthermore, the molecular electronic component should adjoin the conductor to form an electrical contact that is not resistive. See for example, Reed et al, Applied Physics Letters, 2001, vol. 78, no. 23, pp. 3735–3737 incorporated herein by reference. According to some embodiments of the present invention, some preferred conductors will be those that comprise at least one selected from the group consisting of titanium, titanium nitride, zirconium, hafnium, vanadium, niobium, tantalum, tantalum nitride, chromium, tungsten, molybdenum, cobalt, rhodium, iridium, nickel, palladium, platinum, copper, silver, gold, aluminum as well as any combination thereof including alloys. When the first material is a conductor, more preferred materials are those selected from the group consisting of titanium, palladium, platinum, copper, gold, aluminum and any combination thereof including alloys.

According to an alternative embodiment, the first material may be a semiconductor. Analogous to the discussion contained hereinabove in connection with the selection of a suitable conductor, it will be similarly noted that when the first material is a semiconductor that nearly any semiconductor may be used. The semiconductor will be chosen in order to minimize the difference in energy between the molecular electronic component and the semiconductor. In particular, the choice of semiconductor is dictated in large measure by the portion of the molecular electronic component that is in direct contact with the semiconductor surface, sometimes known as the alligator clip. Specifically, the semiconductor is selected that can provide for a small energy difference between the conduction bands in both the molecular electronic component and the semiconductor surface. Although there are a nearly infinite number of materials which may be chosen when the first material is a semiconductor, preferred materials are selected from the group consisting of silicon (Si), doped silicon, doped polysilicon, gallium and its compounds, compounds of arsenic, compounds of nitrogen, indium and its compounds, germanium and its compounds, gallium arsenide (GaAs), gallium nitride (GaN), titanium nitride (TiN), silicon carbide (SiC), aluminum phosphide (AlP), aluminum arsenide (AlAs), aluminum antimonide (AlSb), gallium phosphide (GaP), gallium antimonide (GaSb), indium phosphide (InP), indium arsenide (InAs), indium antimonide (InSb), zinc sulfide (ZnS), zinc selenide (ZnSe), zinc telluride (ZnTe), cadmium sulfide (CdS), cadmium selenide (CdSe), cadmium telluride (CdTe), lead sulfide (PbS), lead selenide (PbSe), lead telluride (PbTe) and any combination thereof. Particularly preferred semiconductors according to a preferred embodiment of the present invention comprise doped silicon or doped polysilicon.

It should be noted that any of the first materials listed hereinabove may be further doped with a component to alter its electronic behavior making said material a more efficient conductor or semiconductor. There are a very large number of dopants that exist which are acceptable as dopants in the present invention. However, preferred dopants include arsenic, phosphorus, antimony and boron. Indeed, according to a preferred embodiment of the present invention, silicon doped with arsenic is a preferred doped semiconductor for use as a first material.

The first material of the present method is formed in a given shape and orientation onto a substrate. The first material may assume a broad range of shapes and still lie within the scope of this invention. However, according to a preferred embodiment, the first material assumes the shape of a wire. The wire may have a cross-section of any shape including square, rectangular, and circular and will have a thickness that is dictated in part by the current requirements of the device. The wire preferably has a thickness between 5 nm and 1000 nm. More preferably, the wire has a thickness between about 100 nm and about 500 nm.

According to one embodiment, the substrate is in the shape of a flat plane and the wire of first material has a primary axis that is parallel with the plane of the substrate. The substrate of the present invention is an insulating substrate that serves to confer structural support as well as electrical grounding for the device. A broad range of insulators can serve as substrates including many common high temperature glasses such as pyrex or quartz glass plate. Preferably, the insulating substrate comprises at silicon or gallium arsenide. Alternatively, it is conceivable that various semi-rigid polymers that are stable to 400° C. could also be used. Most preferably the insulating substrate is a reversed-biased p/n junction silicon wafer. Alternatively, a silicon-on-insulator (SOI) wafer may serve as the insulated silicon substrate.

A wide range of techniques exist for depositing a quantity of material onto a substrate including many variants of chemical vapor deposition (CVD) including but not limited to atmospheric pressure chemical vapor deposition (APCVD), low pressure CVD (LPCVD), plasma enhanced CVD (PECVD), and metal organic CVD (MOCVD). Other suitable techniques for depositing a material include epitaxy techniques such as for example vapor phase- and molecular beam-epitaxy. Yet other methods may be used to deposit a quantity of material including but not limited to evaporation, sputtering, and the like. Indeed, a particularly acceptable method of fabrication may use a standard photoresist/etch/clean sequence that is well-known within the art and may include the use of negative or positive photoresists. A preferred lithographic method for shaping the first material onto the substrate comprises depositing a layer of the first material onto the substrate; depositing a layer of a photoresist on the first material; exposing the photoresist to radiation of suitable wavelength via a patterned mask to imprint the desired shape; removing unexposed photoresist and etching unprotected first material to leave photoresist and first material in a desired pattern; and removing exposed photoresist to leave a desired pattern of the first material. Those in the art will recognize this sequence as one of many lithography/etch sequences common throughout the art. It will be appreciated that any comparable lithography/etch sequence may be used including those employing negative and positive photoresists.

The invention further comprises depositing a second material onto the first material in a manner sufficient to obtain a uniform layer of desired thickness of the second material. The second material of the present invention is substantially an insulating dielectric layer. It is a feature of the method that the dielectric layer is a material to which precise techniques of oxide growth may be applied. It should be pointed out, however, that materials other than oxides (such as nitrides) may serve equally well in this regard. Techniques of oxide growth are explained in, for example, A. Braun, "Thermal Processing", Semiconductor International, Vol. 26, No. 3, March 2003, pp. 44–48, incorporated herein by reference. A currently available technique for oxidizing silicon into a thin layer of silicon oxide is controlled oxide growth via furnace oxidation. Although the oxide obtained from furnace oxidation is of sufficient quality, it tends to be a method poorly suited for growing layers that are uniform at thicknesses approaching 2 nm. One notable feature of the invention to be appreciated is that the use of alternative techniques such as atomic layer deposition (ALD) permit for the growth of uniform layers of dielectric materials other than silicon dioxide. More particularly, it will be appreciated that ALD is a preferred technique able to precisely and consistently produce uniform layers between about 0.1 and 5 nm in thickness. In particular, the preferred ALD technique is characterized by deposition rates as low as 1 angstrom per cycle, allowing for a high degree of precision in layer growth. In this way, layers of desired thickness are obtained based on the number of deposition cycles employed.

The layers obtained tend to be characterized by a high degree of uniformity with respect to smoothness. Indeed, according to one embodiment the present invention provides a method of obtaining layers that are exceptionally smooth, preferably exhibiting a maximum peak height that projects no more than about 3 Å from the surface of the deposited second material.

It will be noted that the thickness of the second material determines the width of the gap in the present device. As will be fully discussed hereinbelow in connection with other aspects of this invention, the gap is filled with at least one molecular electronic component after the first and third materials, being conductors or semiconductors, have been deposited. In this way, the gap is formed prior to introduction of the molecular electronic component and the integrity of the inherently delicate molecular electronic component is preserved. According to some embodiments of this invention, the molecular electronic component is a conjugated organic species of discrete length as distinct from a conducting organic polymer, for instance. Some representative conjugated organic species may be found in "Molecular Electronics: Commercial Insights, Chemistry, Devices, Architecture and Programming" by James M. Tour, World Scientific, 2003, incorporated herein by reference. According to a particularly preferred embodiment of the invention, said conjugated organic species is permitted to assemble in what is known as a self-assembled monolayer (SAM) described, for example, in "Molecular Electronics: Commercial Insights, Chemistry, Devices, Architecture and Programming", James M. Tour, World Scientific, 2003, and references cited therein, incorporated herein by reference. As used herein, a self-assembled monolayer (SAM) is a single layer of molecules permitted to assemble into a thermodynamically-stable, repeating pattern on a clean, flat surface. The molecules within the layer typically have a length that exceeds the thickness of the cross-section and are arranged such that their primary axes are aligned parallel with each other and at some angle to the surface. The monolayer so-formed is a well-defined arrangement of definite height, said height being the thickness of the monolayer and corresponding to the vertical distance from surface to the termini of the organic species. According to one embodiment, the layer of second material is deposited onto said first material to correspond to the height of the SAM formed from a given organic species. According to this embodiment, the optimal thickness of the dielectric layer of second material will correspond to the effective length of the conjugated organic species rather than the actual length, the effective length being governed by such factors as the angle of attachment of the organic species to the surface, the orientation of the particular chemical groups within the organic species and the like. In this way it is believed that a superior contact between first and third materials (electrodes) and the molecular electronic component can be attained thereby resulting in superior electrical contact.

The thickness of the second material is therefore chosen based on the width desired in the nanoscale device and the thickness of the molecular electronic component. Preferably, the thickness of the uniform layer is between about 0.1 nm and about 100 nm, more preferably between about 1 nm and about 50 nm. According to some embodiments of this invention, the thickness of the uniform layer corresponds to the dimension of the monolayer formed by the molecular electronic component. In particular, according to one embodiment wherein the gap is to be filled with a molecular electronic component that assembles into a self-assembled monolayer, it is desirable to create a gap between about 1 Å and about 50 Å; and most preferably between about 5 Å and about 20 Å. According to yet another embodiment wherein the gap is to be filled with a plurality of metallic nanoparticles that are coated with organic molecules, it is desirable to create a gap between about 50 Å and 200 Å.

It is a further aspect of this method that the surfaces comprising the gap are substantially smooth. This derives from the smoothness of the layer of second material that is deposited onto the first material. Specifically, the method of depositing the second layer is such that it permits for the creation of a uniformly smooth layer of second material atop the first layer. Preferably, the deviations in the thickness of the uniform second layer are no greater than about 20%

The second material of the present invention is, as stated above, substantially an insulating dielectric. There are a large number of inorganic binary oxides that exist and many of them can serve as insulating dielectrics according to the present invention. See for example, "Alternative Gate Dielectrics for Microelectronics", MRS Bulletin, Vol. 27, No. 3, March 2002. Preferred second materials comprise oxides or nitrides of yttrium, lanthanum, titanium, zirconium, hafnium, tantalum, molybdenum, iridium, nickel, palladium, platinum, copper, gold, aluminum, gallium, indium, silicon, germanium, or arsenic or any combination thereof. More preferably, the second material will comprise yttrium oxide, lanthanum oxide, titanium(IV) oxide, zirconium(IV) oxide, hafnium(IV) oxide, silicon oxide, silicon nitride, silicon oxynitride or aluminum oxide or any combination thereof. According to one preferred embodiment of the present invention, silicon dioxide is a particularly preferred insulating dielectric.

In an alternative embodiment of the present invention, the insulating second material is deposited in a manner effective for reducing the capacitance between the first and third materials. That is, for two conductors or semiconductors in close proximity, the current through the two electric leads may capacitively couple resulting in a slowing of the circuit. According to this alternative embodiment, a layer of insulating dielectric is deposited in a layer that is significantly thicker except in the immediate vicinity of intersection between the first and third materials. The second material may be deposited in a layer that is greater than 100 nm in thickness over the first material. An etching procedure is carried out to provide sloping sides in the dielectric layer about the intersection that will subsequently form the gap of the nanoscale electronic device.

The present method still further comprises depositing a quantity of third material onto said second material in a given shape and orientation such that when viewed from at least one direction said first, second and third materials share a common area of intersection. The material chosen for the third material will be substantially similar to those materials described in connection with the first material. That is, the third material may be a conductor or semiconductor. Indeed, the choice of third material is similarly governed by the factors described previously in connection with the first material. Thus, it will be the difference in electronic properties between the molecular electronic component and the third material that will, in large part, govern the choice of third material.

The present method further comprises removing at least a portion of the second material in such a manner as to create a gap between said first and third materials. There exist many etchants and procedures suitable for selectively removing the dielectric second material while leaving the conductor or semiconductor first and third materials unaffected. Suitable etchants are selected based on their tunability with respect to etching power. That is, a desirable etchant will allow for the removal of a defined amount of dielectric second material in a reasonable amount of time. In a preferred embodiment, a portion of the second material is etched and removed such that only the second material near the edges of the area of intersection of the first and third materials is removed, thereby leaving a portion of the second material in and around the center of the area of intersection. In an alternative embodiment, the entire second material within the area of intersection between the first and third materials is removed.

The method still further comprises adding at least one molecular electronic component to said gap. As used herein a molecular electronic component will be any molecule, molecular-sized entity, plurality of molecules or entities that possess at least one electronic property. For example, the molecular electronic component may be a resistor, diode, conductor, resonant tunneling diode, resonant tunneling resistor, capacitor and the like. The molecular electronic component may be a molecular species of discrete length and structure, for example an oligophenylene ethynylene. The molecular electronic component may comprise nanoparticles such as any of the nanotubes including single-walled, multi-walled, chiral, achiral, single-stranded, and bundled; any of the fullerenes including $C_{60}$, $C_{72}$, $C_{84}$ and the higher congeners; or nanoshells comprising nested, layered composites as nanoscale spheres. According to one embodiment, the molecular electronic component may comprise an assemblage of both oligomeric organic species and inorganic nanoparticles, such as metallic nanoshells wherein the organic species act as wires to join the nanoshells in an interconnecting network. In a particularly preferred embodiment, such an assemblage confers to the electronic device the property of negative differential resistance (NDR); that is, said device is a resonant tunneling diode (RTD). See "Molecular Electronics: Commercial Insights, Chemistry, Devices, Architecture and Programming", pp. 242–243, by James M. Tour, World Scientific, 2003, incorporated herein by reference.

The method may still further comprise sealing the electronic device with a passivating film. As is known to one skilled in the art, it is common to heremetically seal devices. Therefore, passivating films may be employed in the present invention to protect the assembled nanoscale electronic device from moisture and oxidation. It will be appreciated by the skilled artisan that the molecular electronic components may be susceptible to degradation in the presence of oxygen, moisture or other contaminants. It is envisioned that the passivating film will present a barrier to such contaminants thereby preventing degradation of the molecular electronic components.

It will be recognized by those of ordinary skill in the art that the present invention can include variations not explicitly stated herein without deviating from the scope of this invention. For example, those of ordinary skill in the art will recognize that the devices made using the present process can extend to any one of a number of types of electronic devices. In particular, the devices may serve as any type of memory unit including, but not limited to, random access memory (RAM), dynamic random access memory (DRAM) and the like. It will also be noted that the thickness and composition of both the metal and dielectric can be varied to best accommodate the organic molecule selected for self-assembly. For example, a molecule with a demonstrated ability to form self-assembled monolayers on silicon surfaces could be placed in a structure emulating that of a metal oxide semiconductor (MOS) employing silicon as the first material, hafnium dioxide as the second material and polysilicon as the third material. Alternatively, a molecular electronic component forming a self-assembled monolayer (SAM) on an aluminum first material might further feature aluminum oxide as the insulating dielectric second material and aluminum as the third material. It will also be recognized that any molecule of suitable structure may serve equally well as the molecular electronic component in the self-assembled monolayer (SAM). It will also be recognized that other methods for depositing or etching the materials cited herein can also be used without deviating from the scope of the present method.

To more completely describe the invention, reference will be made to the accompanying figures. It shall be understood that the following is a description of one embodiment of the present invention that is intended to illustrate and further clarify the present invention. In no way, should this description be regarded as limiting the invention in any way. The invention is limited only by the claims.

Figure 1A:
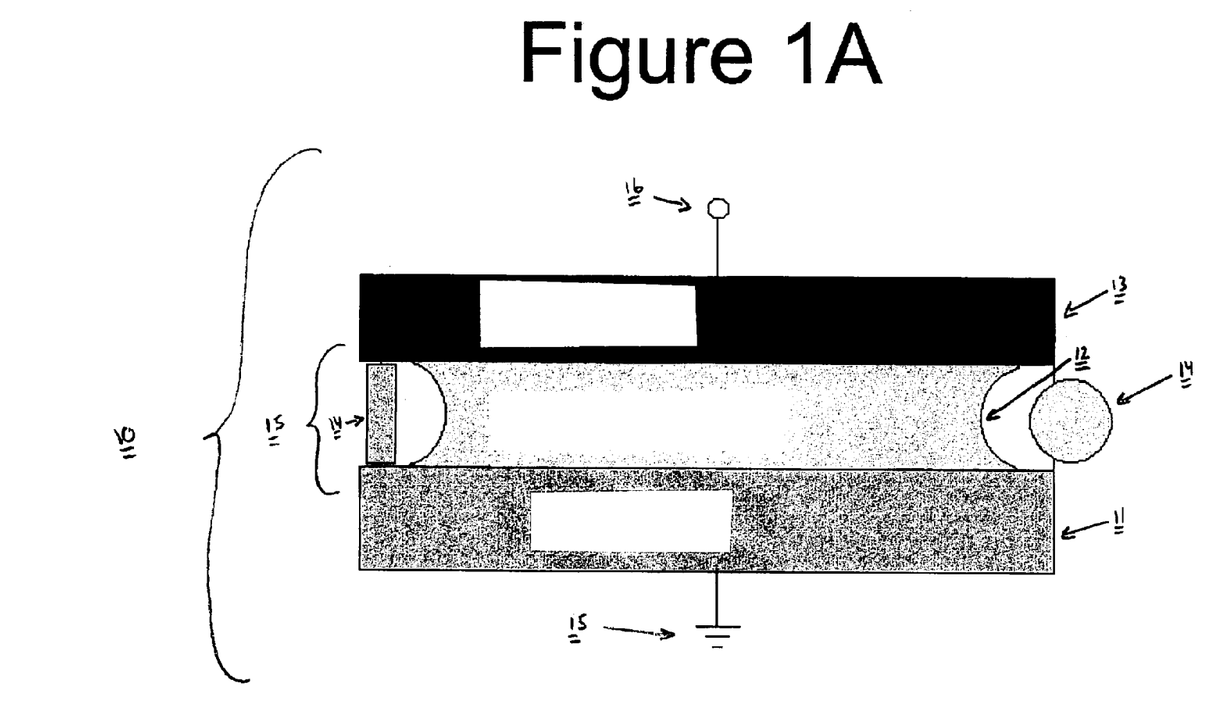
FIG. 1A depicts a cross-sectional view showing the details of a nanoscale electronic device.

FIG. 1A depicts a cross-sectional view of nanoscale electronic device 10 made according to the method of the current invention. Nanoscale electronic device 10 comprises first material 11 which may be a conductor or semiconductor; a second material 12 which shall be an insulating dielectric of controlled thickness and smoothness; and a third material 13 which may be a conductor or semiconductor. Gap 15 is carved from a portion of second material 12 between first and third materials, 11 and 13, respectively. Molecular electronic component 14 fills the gap 15. Device 10 further comprises a connection to insulating substrate 15, and a connection to metallic interconnect 16.

Figure 1B:
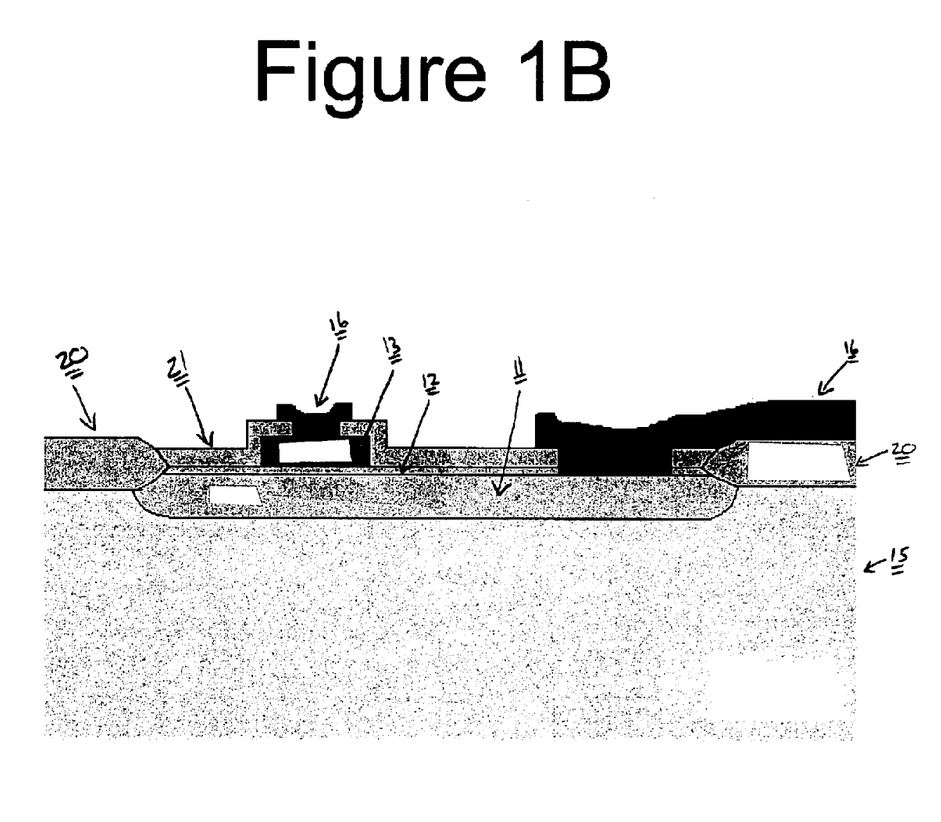
FIGS. 1B and 1C are cross-sectional views of a circuit and depict the process by which a nanoscale electronic device is introduced to the circuit.
Figure 1C:
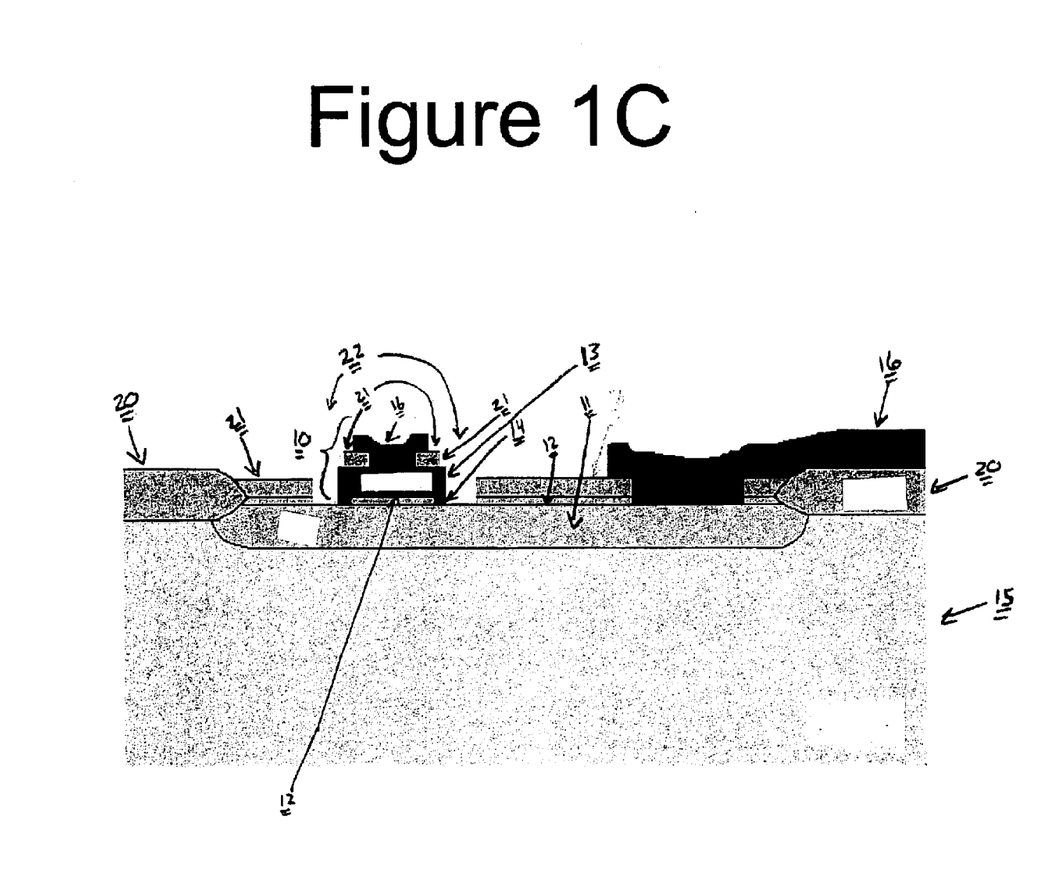

FIGS. 1B and 1C depict the process by which a nanoscale electronic device 10 is introduced to a suitably prepared circuit.

FIG. 1B is a cross-sectional view of a circuit. Insulating substrate 15 forms the base for said circuit and could be, for example, p doped silicon. First material 11, a conductor or semiconductor, is introduced by techniques known to one of ordinary skill in the art. First material 11 could be, for example, n+ doped silicon grown on p doped insulating substrate 15 via a standard arsenic implantation followed by high temperature furnace treatment. Second material 12 is a dielectric layer preferably deposited upon 11 by atomic layer deposition to obtain a layer of dielectric that may be as thin as 2 nm, according to one embodiment. The method further features deposition of a third material 13 which may be a conductor or semiconductor. Third material 13 may be, according to one preferred embodiment, doped polysilicon. Third material 13 may be deposited by means known to those in the art, such as, for example, by deposition of a layer of third material 13, followed by a standard photoresist/etch/cleanup sequence. In similar fashion can metal interconnect 16 be added, said means serving as electric interconnect to third material 13 and first material 11. Field silicon oxide 20 may be grown from silicon insulating substrate 15 by ordinary means, such as exposure to oxygen or steam in a furnace. Low temperature silicon oxide layer 21 is deposited in a layer that may be as thick as 100 nm atop second material 12 and third material 13 by ordinary deposition means known to the skilled artisan.

FIG. 1C is the circuit after patterning with a photoresist and selective etching of the region about third material 13. A selective etchant is used to remove oxide rather than metal to leave wells 22. The etchant is further successful in removing at least a portion of second material 12 to create gaps 15 that penetrate between first and third materials 11 and 13, respectively. Subsequent addition of molecular electronic component 14 to gaps 15 completes the assembly of nanoscale electronic device 10.

What is claimed is:

1. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein said first material is a conductor comprising at least one selected from the group consisting of titanium, titanium nitride, zirconium, hafnium, vanadium, niobium, tantalum, tantalum nitride, chromium, tungsten, molybdenum, cobalt, rhodium, iridium, nickel, palladium, platinum, copper, silver, gold, aluminum and any combination thereof.

2. A method of making a nanoscale electronic device wherein said device comprises
   a first material selected from the group consisting of conductors and semiconductors;
   a second material that is an insulator;
   a third material selected from the group consisting of conductors and semiconductors; and
   at least one molecular electronic component
   wherein a gap between about 0.1 nm and about 100 nm exists between said first and third materials and said gap comprises at least one said molecular electronic component and, optionally, a portion of said second material, said method comprising:
   (a) depositing a quantity of said first material in a given shape and orientation onto a substrate;
   (b) depositing a quantity of said second material onto said first material in a manner sufficient to obtain a uniform layer of desired thickness of said second material on said first material;
   (c) depositing a quantity of said third material onto said second material in a given shape and orientation such that when viewed from at least one direction said first, second and third materials share a common area of intersection;
   (d) removing at least a portion of the second material in such a manner as to create a gap between said first and third materials; and
   (e) adding at least one molecular electronic component to said gap;

and wherein said first material is a conductor comprising at least one selected from the group consisting of titanium, palladium, platinum, copper, gold, aluminum and any combination thereof.

3. A method of making a nanoscale electronic device wherein said device comprises
   a first material selected from the group consisting of conductors and semiconductors;
   a second material that is an insulator;
   a third material selected from the group consisting of conductors and semiconductors; and
   at least one molecular electronic component
   wherein a gap between about 0.1 nm and about 100 nm exists between said first and third materials and said gap comprises at least one said molecular electronic component and, optionally, a portion of said second material, said method comprising:
   (a) depositing a quantity of said first material in a given shape and orientation onto a substrate;
   (b) depositing a quantity of said second material onto said first material in a manner sufficient to obtain a uniform layer of desired thickness of said second material on said first material;
   (c) depositing a quantity of said third material onto said second material in a given shape and orientation such that when viewed from at least one direction said first, second and third materials share a common area of intersection;
   (d) removing at least a portion of the second material in such a manner as to create a gap between said first and third materials; and
   (e) adding at least one molecular electronic component to said gap;

and wherein said first material is a semiconductor comprising silicon doped with arsenic.

4. A method of making a nanoscale electronic device wherein said device comprises
   a first material selected from the group consisting of conductors and semiconductors;
   a second material that is an insulator;
   a third material selected from the group consisting of conductors and semiconductors; and
   at least one molecular electronic component
   wherein a gap between about 0.1 nm and about 100 nm exists between said first and third materials and said gap comprises at least one said molecular electronic component and, optionally, a portion of said second material, said method comprising:
   (a) depositing a quantity of said first material in a given shape and orientation onto a substrate;
   (b) depositing a quantity of said second material onto said first material in a manner sufficient to obtain a uniform layer of desired thickness of said second material on said first material;
   (c) depositing a quantity of said third material onto said second material in a given shape and orientation such that when viewed from at least one direction said first, second and third materials share a common area of intersection;
   (d) removing at least a portion of the second material in such a manner as to create a gap, between said first and third materials; and
   (e) adding at least one molecular electronic component to said gap;

and wherein depositing a quantity of said first material onto said insulating substrate comprises
   depositing a layer of said first material onto said substrate;
   depositing a layer of a photoresist onto said first material;
   exposing said photoresist and first material to radiation of suitable wavelength via a patterned mask to imprint the shape desired for the first material;
   removing unexposed photoresist and etching unprotected first material to leave photoresist and first material in desired pattern; and
   removing exposed photoresist to leave desired pattern of first material.

5. A method of making a nanoscale electronic device wherein said device comprises
   a first material selected from the group consisting of conductors and semiconductors;
   a second material that is an insulator;
   a third material selected from the group consisting of conductors and semiconductors; and
   at least one molecular electronic component
   wherein a gap between about 0.1 nm and about 100 nm exists between said first and third materials and said gap comprises at least one said molecular electronic component and, optionally, a portion of said second material, said method comprising:
   (a) depositing a quantity of said first material in a given shape and orientation onto a substrate;

(b) depositing a quantity of said second material onto said first material in a manner sufficient to obtain a uniform aver of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein the insulating substrate is an organic polymer.

6. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein the insulating substrate is a reversed-biased p/n junction silicon wafer.

7. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first second and third materials share a common area of intersection;

(d) removing at least a portion of the second material in such a manner as to create a gap between said first and third materials; and (e) adding at least one molecular electronic component to said gap;

and wherein said second material comprises a nitride of at least one selected from the group consisting of yttrium, lanthanum, titanium, zirconium, hafnium, tantalum, molybdenum, iridium, nickel, palladium, platinum, copper, gold, aluminum, gallium, indium, silicon and germanium and any combination thereof.

8. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a pap between said first and third materials; and (e) adding at least one molecular electronic component to said gap:

and wherein the thickness of the uniform layer corresponds to the dimension of the molecular monolayer formed from the molecular electronic component.

9. The method according to claim 8 wherein the distance of the gap between said first and third materials is between about 1 nm and about 50 nm.

10. The method according to claim 8 wherein the distance of the gap between said first and third materials is between about 1 nm and about 10 nm.

11. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein the roughness of the uniform layer exhibits a maximum peak that projects no more than about 3 Å from the surface of the deposited second material.

12. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein the second material is deposited onto the first material using a technique of controlled oxide growth.

13. The method according to claim 12 wherein the technique of controlled oxide growth is atomic layer deposition (ALD).

14. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein said third material is a conductor comprising at least one selected from the group consisting of titanium, titanium nitride, zirconium, hafnium, vanadium, niobium, tantalum, tantalum nitride, chromium, tungsten, molybdenum, cobalt, rhodium, iridium, nickel, palladium, platinum, copper, silver, gold, aluminum and any combination thereof.

15. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein said third material is a conductor comprising at least one selected from the group consisting of titanium, palladium, platinum, copper, gold, aluminum and any combination thereof.

16. A method of making a nanoscale electronic device wherein said device comprises
- a first material selected from the group consisting of conductors and semiconductors;
- a second material that is an insulator;
- a third material selected from the group consisting of conductors and semiconductors; and
- at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein said third material is a semiconductor comprising polysilicon doped with arsenic.

17. A method of making a nanoscale electronic device wherein said device comprises
- a first material selected from the group consisting of conductors and semiconductors;
- a second material that is an insulator;
- a third material selected from the group consisting of conductors and semiconductors; and
- at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein the molecular electronic component comprises at least one selected from the group consisting of nanotubes, fullerenes, nanoshells and any combination thereof.

18. A method of making a nanoscale electronic device wherein said device comprises
- a first material selected from the group consisting of conductors and semiconductors;
- a second material that is an insulator;
- a third material selected from the group consisting of conductors and semiconductors; and
- at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein at least one molecular electronic component is a conjugated organic compound.

19. A method of making a nanoscale electronic device wherein said device comprises
- a first material selected from the group consisting of conductors and semiconductors;
- a second material that is an insulator;
- a third material selected from the group consisting of conductors and semiconductors; and
- at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein the organic compound is permitted to assemble in a monolayer, multilayer or network comprising nanoparticles and organic molecules.

20. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and further comprising depositing a passivating film over the electronic device.

21. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising:

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein depositing a quantity of said second material is carried out in a manner to provide a layer of second material that is thicker than the layer of second material in the area of common intersection of said first, second, and third materials.

22. A method of making a nanoscale electronic device wherein said device comprises a first material selected from the group consisting of conductors and semiconductors;

a second material that is an insulator;

a third material selected from the group consisting of conductors and semiconductors; and at least one molecular electronic component wherein a gap between about 0.1 nm and about 100 nm exists between said first and third materials and said gap comprises at least one said molecular electronic component and, optionally, a portion of said second material, said method comprising;

(a) depositing a quantity of said first material in a given shape and orientation onto a substrate;

(b) depositing a quantity of said second material onto said first material in a manner sufficient to obtain a uniform layer of desired thickness of said second material on said first material;

(c) depositing a quantity of said third material onto said second material in a given shape and orientation such that when viewed from at least one direction said first, second and third materials share a common area of intersection;

(d) removing at least a portion of the second material in such a manner as to create a gap between said first and third materials; and (e) adding at least one molecular electronic component to said gap;

and wherein the second material is etched in a manner to provide a layer of second material that slopes to a smaller thickness of second material in the area of common intersection of said first, second and third materials.

* * * * *